United States Patent [19]

Roos

[11] 4,268,610

[45] May 19, 1981

[54] PHOTORESIST FORMULATIONS

[75] Inventor: Leo Roos, San Jose, Calif.

[73] Assignee: Hercules Incorporated, Wilmington, Del.

[21] Appl. No.: 91,635

[22] Filed: Nov. 5, 1979

[51] Int. Cl.³ .............................................. H05K 3/18
[52] U.S. Cl. .................................... 430/281; 430/286; 430/315; 430/319; 430/525; 430/920; 427/96; 427/98; 148/6.14 R
[58] Field of Search ................... 148/6.14 R; 430/920, 430/910, 311, 281, 286, 282, 283, 284, 315, 319, 525; 427/96, 98

[56] References Cited

U.S. PATENT DOCUMENTS

| | | | |
|---|---|---|---|
| 3,622,334 | 11/1971 | Hurley et al. | 430/281 |
| 3,645,772 | 2/1972 | Jones | 148/6.14 R |

FOREIGN PATENT DOCUMENTS

| | | |
|---|---|---|
| 1275471 | 5/1972 | United Kingdom . |
| 1286879 | 8/1972 | United Kingdom . |
| 1311130 | 3/1973 | United Kingdom . |
| 1466558 | 3/1977 | United Kingdom . |
| 1472527 | 5/1977 | United Kingdom . |

*Primary Examiner*—Ralph S. Kendall
*Attorney, Agent, or Firm*—Marion C. Staves

[57] ABSTRACT

Photoresist compositions with improved adhesion properties are provided for use in making printed circuit boards, lithographic plates, relief image plates or cylinders and for other applications in the graphic arts. The subject invention also provides for methods and photoresist elements utilizing the photoresist compositions. The photoresist compositions include, in addition to a photopolymerizable compound, a photo initiator, a polymeric binder, and other optional additives and N-substituted benzotriazoles which serve as improved adhesion promoters.

12 Claims, No Drawings

PHOTORESIST FORMULATIONS

BACKGROUND OF THE INVENTION

The subject invention relates to photoresist formulations for use in making printed circuit boards, lithographic plates, relief images and for various other uses in the graphic arts. More specifically, it deals with photoresist formulations with improved adhesion properties in both solvent and aqueous developable film so as to resist chemical attack and other kinds of degradation during etching, plating or other processing in any known manner.

A widely used technique in the manufacture of photoresists consists of the following steps: (1) a photopolymerizable composition is laminated on to a composite of a copper foil heat-set on a phenolic or epoxy resin board; (2) the laminate is then exposed imagewise to actinic light through a transparency in contact with a test pattern; (3) after exposure, the unexposed, pliable portions of the polymerizable composition are removed or washed away with a suitable solvent, thus exposing the underlying copper layer; and (4) the resulting copper layer is etched away for a sufficiently long period of time to form the desired depth of etch in the laminate; alternatively, the patterned metal surface is plated with a metal, such as copper, nickel, tin, chromium, silver or gold which is deposited in areas unprotected by the polymerized resist. When a sufficient amount of the metal has been deposited, the laminate is then treated to permit stripping of the resist mask from the laminate, thus providing a part having an etched or plated configuration corresponding to the pattern of the template or the negative through which the film was initially exposed.

It is especially important that the photoresist formulations employed to protect certain areas of the laminate to be plated or etched be chemically inert and resistant to corrosive etching or plating solutions, in order to obtain plated or etched configurations having sharp line definition and exhibiting a minimum amount of undercutting of the surface adjacent to the masked edges. It is equally important that the resist compositions exhibit good adhesion to the copper laminate, especially during the plating or etching operation, to prevent ingress of the etchant or plating solution between the resist and the substrate and in order to avoid any etching, printing or plating of the area or the part beneath the resist which it masks. Another criterion that must be met in a good photoresist material is that it can be readily stripped or removed from the surface subsequent to the plating or etching operation.

There has been a great deal of research activity devoted to the development of chemically inert photoresist compositions which exhibit the above-described properties, with little success and most of the formulations currently available fall far short of the requirements for exposure to certain types of plating or etching baths. Most often, the corrosive etching or plating solutions employed seriously affect the photoresist such that the entire resist layer or parts thereof peel off or are otherwise destroyed; or in the plating process, the electrolytically or electroless plated metal becomes detached from the laminate surface and gets washed away; the desired printed pattern thus becomes pitted, marred, discolored or haloed. Most of the prior art processes require the employment of a persulfate etch following the etching or electroless plating process, to remove the photoresist mask. This treatment not only removes the photoresist film but also dissolves some of the deposited copper. Sufficient allowance must therefore, be made for the loss of copper, so that the desired depth of copper plating is obtained. Furthermore, this persulfate treatment also results in pitting and marring of the metal surface thus making it unacceptable for printed circuit boards or lithographic plates or the like.

The prior art photopolymerizable compositions often contain small amounts of a dye which serves two purposes: (1) the dye imparts a color to the composition which is retained in the resist image and thus facilitates visibility and inspection for imperfections of the image on the printing board prior to the plating or etching process; (2) in many instances, the presence of the dye measurably increases the light sensitivity of the composition.

Prior art compositions formulated with certain substituted imidazoles and some benzotriazoles to somewhat improve the bonding qualities of photoresists, but these compounds also suffer from certain deficiencies. There is some peeling and blistering of the laminate observed if not subjected to persulfate treatment. The dry, unexposed photoresist films exhibit a relatively low shelf life under ambient conditions. The solvent of choice is also critical in that with some solvents, any solvent that gets entrapped in the film causes weathering problems in the dry unexposed photoresist films.

In recent times, however, some new benzotriazole derivatives have been synthesized which exhibit high solubility in a wide range of functional fluids. These compounds, on account of their high solubility in a wide range of solvents, offer tremendous advantages as adhesion promoters in both aqueous and solvent developable photoresist films. They also obviate the necessity for a persulfate etch to remove the photoresist, a process which destroys deposited copper.

It is an object of this invention, therefore, to provide improved photoresist formulations containing an adhesion promoter which also stabilize the photoresist formulations. The preferred adhesion promoter exhibits the following desired properties: (1) it is capable of easy removal from the metal surface during the development step; (2) it has a sufficiently high boiling point, greater than about 200° C.; (3) it is stable in the coating for a period of one year or longer under ambient conditions; (4) it is stable at elevated temperatures (33°–35° C.) for at least 4–8 weeks; (5) it does not measurably interfere with the photopolymerization reaction; (6) it does not interfere with the plating cycle or leach into the plating bath; and (7) it enables the metal surface to be cleaned with water or weak acid or basic solution without the need for a persulfate etch.

DESCRIPTION OF THE RELEVANT PRIOR ART

There is a large number of published articles and issued patents covering this very fertile area of research. Only the most relevant references are cited. U.S. Pat. No. 3,645,772 describes a process for improving the bonding of a photoresist to copper, whereby the copper surface to be plated is initially treated with nitrogen-containing organic compounds, mostly substituted imidazoles, and then later coated with the photopolymerizable resist containing small amount of some heterocyclic compounds, notably substituted imidazoles, benzotriazoles, and benzothiazoles. These prior art benzotriazoles and benzothiazoles have limited use due to their sparing solubility. British Pat. Nos. 1,466,556 and 1,472,527 describe the synthesis and uses for some new benzotriazole derivatives.

SUMMARY OF THE INVENTION

Improved formulations and processes are provided for the preparation of photoresist films which are highly resistant to chemical attack during the plating and etching cycles. The formulations of the subject invention comprise a photopolymerizable monomer dispersed in a solution containing, in addition, small quantities of a photoinitiator, a plasticizer or polymeric binder, an N-substituted benzotriazole as an adhesion promoter and optionally, a contrast colored dye. The subject additive not only improves the bonding of the photoresist to copper but also yields better, pinhole free printed circuit boards and other relief plates for various applications in the graphic arts. The subject compositions with the adhesion promoter provide for the ability to clean the metal clad laminate in water or relatively weak acidic or basic solutions without the need for the customary persulfate etch. The adhesion promoter also stabilizes any color used in the photoresist compositions.

DESCRIPTION OF THE PREFERRED EMBODIMENTS

The subject invention provides for improved photoresist compositions which exhibit superior bonding properties and stability as compared to prior art formulations. The adhesion promoters of this invention are N-substituted orthoaromatic di- and triazoles that are highly soluble in a wide variety of aqueous and nonaqueous solvents. The use of these compounds render the formulations of the subject invention adaptable for use with both solvent and aqueous developable films. Particular advantages as enumerated earlier are observed with the subject compositions.

The compositions of the subject invention for the most part contain about 10–50, preferably 15–30, weight percent of one or more addition photopolymerizable monomers, about 35–80, preferably, 40–80 weight percent of a polymeric binder, about 0.001 to 10, preferably 0.01 to 1.0, weight percent of a free radical or photopolymerization initiator, about 0.001 to 2, preferably 0.1 to 2.0 weight percent of a suitable contrast colored dye, about 0.01 to 5 weight percent of a heterocyclic adhesion promoter-stabilizer compound formulated in an organic or aqueous solvent, the total solids comprising about 10–50, preferably 10–30 weight percent. Other coadditives such as antioxidants, plasticizers, fillers, rust inhibitors and the like may be optionally included.

The addition photopolymerizable monomers which find application in the subject invention are non-gaseous, may contain from 1 to 4, usually 1 to 3, preferably 2 to 3 centers of ethylenic unsaturation and must be capable of homopolymerization or cross-linked copolymerization. Suitable compounds include alkylene or polyalkylene glycol diacrylates. Compounds containing vinylidene groups conjugated with ester or amide linkages are particularly suitable. Illustrative examples include but are not limited to ethylene diacrylate; diethylene glycol diacrylate; glycerol diacrylate; glycerol triacrylate; 1,3-propanediol dimethacrylate; 1,2,4-butanetriol trimethacrylate; 1,4-benzenediol dimethacrylate; 1,4-cyclohexanediol diacrylate; pentaerythritol tri- and tetramethacrylate; pentaerythritol tri- and tetraacrylate; 1,3-propanediol diacrylate; 1,5-pentanediol dimethacrylate; the bis-acrylates and methacrylates of polyethylene glycols of molecular weight 100–1500 and the like; unsaturated amides, particularly those of the $\alpha$-methylene carboxylic acids, and especially those of alpha, omega-diamines and oxygen-interrupted omega-diamines, such as methylene bisacrylamide; methylene bis-methacrylamide; 1,6-hexamethylene bisacrylamide; diethylene triamine tris-methacrylamide; bis(methacrylamidopropoxy) ethane; $\beta$-methacrylamideethyl methacrylate; and N-[($\beta$-hydroxyethyloxy) ethyl] acrylamide.

Especially preferred acrylyl compounds are triethylene glycol diacrylate, tetraethylene glycol diacrylate, pentaerythritol triacrylate, trimethylol propane triacrylate and pentaerythritol tetraacrylate.

Photoinitiators used in the subject compositions are activatable by actinic light and thermally inactive below about 185° C. Examples include but are not limited to substituted or unsubstituted polynuclear quinones, such as, 9,10-anthraquinone; 1-chloroanthraquinone, 2-chloroanthraquinone, 2-methylanthraquinone; 2-ethylanthraquinone; 2-tert-butylanthraquinone; octamethylanthraquinone; 1,4-naphthaquinone; 9,10-phenanthraquinone; 1,2-benzathraquinone; 2,3-benzanthraquinone; 2-methyl-1,4-naphthaquinone; 2,3-dichloronaphthaquinone; 1,4-di-methylanthraquinone; 2,3-dimethylanthraquinone; 2-phenylanthraquinone; 2,3-diphenylanthraquinone; 3-chloro-2-methylanthraquinone; retenequinone; 7,8,9,10-tetra-hydronaphthacenequinone; 1,2,3,4-tetrahydrobenz(a)anthracene-7,12-dione; vicinal ketaldonyl compounds, such as diacetyl and benzyl; alpha-ketaldonyl alcohols, such as, benzoin and pivaloin, acyloin ethers, e.g., benzoin methyl and ethyl ethers, $\alpha$-hydrocarbon substituted aromatic acyloins; $\alpha$-methylbenzoin; $\alpha$-allylbenzoin; and $\alpha$-phenylbenzoin.

Specific benzoin ethers include benzoin methyl ether, benzoin ethyl ether, benzoin phenyl ether, methylbenzoin; and ethylbenzoin.

Certain aromatic ketones, e.g., benzophenone and 4,4'-bis-(dialkylamino)benzophenones, are also useful. Specific ketones include benzophenone, 4,4'-bis(dimethylamino)benzophenone, 4,4'-bis(diethylamino)-benzophenone, 4-hydroxy-4'-diethylaminobenzophenone, 4-hydroxy-4'-dimethylaminobenzophenone, 4-acryloxy-4'-dimethylaminobenzophenone, and 4-methoxy-4' dimethyl-aminobenzophenone and chlorothioxanthone.

As preformed polymeric binding agent compounds that can be employed are polystyrene, polycarbonate, polyurethane, polyformaldehyde, polyvinyl acetal (including polyvinyl butyral), polyvinyl chloride and copolymers, polyethers (including polyethylene oxide, polypropylene oxide, polytetrahydrofuran), polyacrylates (including polymethyl methacrylate, polyethyl methacrylate, polymethyl acrylate and polyethyl acrylate), polyvinyl esters (including polyvinyl acetate and polyvinyl acetate/acrylate), cellulose esters (including cellulose acetate and cellulose acetate butyrate), cellulose ethers (including methyl cellulose and ethyl cellulose), modified polyolefins (including ethylene/vinyl acetate copolymers) polyvinylidene chloride (including copolymers of vinylidene chloride with acrylonitrile, methyl methacrylate and vinyl acetate), polyamide (including polycaprolactone, polycaprolactam, and polyhexamethylene adipamide) and polyester (including polyethylene glycol terephthalate, and polyhexamethylene succinate).

Thermal polymerization inhibitors may also be present in the preferred compositions. These include p-methoxyphenol, hydroquinone, and alkyl and aryl-substituted hydroquinones and quinones, tert-butyl catechol, pyrogallol, copper resinate, β-naphthol, 2,6-di-tert-butyl p-cresol, 2,2′-methylene-bis-(4-ethyl-6-t-butylphenol), p-tolylquinone, chloranil, aryl phosphites, and aryl alkyl phosphites.

A fluorescent, visible, contrast or leuco dye may also be incorporated in the subject composition as an indicator to insure removal of all of the unexposed portions of the resin and to facilitate inspection of the patterned surface for imperfections, if any. However, the dye of choice must be inert towards the other components of the photoresist formulations and must not interfere with the photopolymerization process. Examples of such dyes include but are not limited to Brilliant Green Dye (C-1-42040), Victoria Blue, substituted naphthalimide dyes such as Calcofluor Yellow HEB, rhodamines and azosols. Illustrative leuco dyes include Crystal Violet, Malachite Green, Basic Blue, Pararosaniline, Rosaniline, Patent Blue A or V, or the like. These are discussed in detail in copending application Ser. No. 015,980 filed Feb. 26, 1979.

N-substituted benzotriazoles of the subject invention which exhibit improved adhesion properties have the general formula:

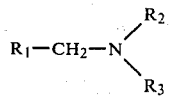

where
$R_1$ has the structure

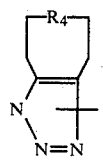

$R_4$ is unsubstituted or mono- or di-substituted benzene or naphthalene; when $R_4$ is substituted, the substituent may be alkyl of from 1 to 12 carbon atoms, preferably 1–6 carbon atoms, more preferably 1–4 carbon atoms, or aralkyl of from 7 to 9 carbon atoms, preferably alkyl benzene, more preferably α,α-dimethyl benzyl radical.

$R_3$ may be equivalent to $R_1CH_2$, $R_2$ or may be different and has the general formula $R_7O$ [(alkylene)O]$_x$-(alkylene) and is a straight- or branched chain alkylene radical having 2 or 3 carbon atoms and x is 0, 1, 3 or 4; an alkenyl radical having from 2 to 20 carbon atoms; or a cyanoalkyl radical having from 2 to 5 carbon atoms; or $R_2$ has its previous significance and $R_3$ is hydrogen, an alkyl radical having from 1 to 20 carbon atoms, an aryl radical having from 6 to 10 carbon atoms, a cycloalkyl radical having from 5 to 12 carbon atoms, an aralkyl radical having from 7 to 9 carbon atoms, a heterocyclic radical or a radical having the formula:

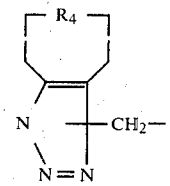

wherein $R_4$ has its previous significance.

The compounds of formula I are Mannich bases and preferred compounds are those wherein the residue $R_4$ is a benzene radical.

Moreover, it is preferred that the substituent on the N atom of the compound of formula I constitutes a hydrophilic function. It is particularly preferred that at least one of $R_2$ and $R_3$ and preferably each, is a residue of formula $R_7O$ [(alkylene)O]$_x$-(alkylene)—wherein $R_7$ is preferably H, x is preferably 0.

When $R_2$ and/or $R_3$ is an alkenyl radical, this radical preferably contains from 3 to 20 carbon atoms, examples being allyl, butenyl, octenyl, decenyl, dodecenyl, tetradecenyl and octadecenyl (oleyl) radicals.

When $R_2$ and/or $R_3$ is a radical $R_7O$ [(alkylene)O]$_x$ (alkylene); preferred instances of this radical are those wherein $R_7$ is hydrogen or an alkyl radical having from 1 to 18 carbon atoms, especially 1 to 8 carbon atoms, for instance hydroxyethylene, methoxyethylene, n-butoxyethylene, methoxyethylene-oxyethylene, n-butoxyethyleneoxyethylene, n-octyldecoxypropyleneoxy-1:2-propylene radicals. Preferred cyanoalkyl substituents $R_2$ and/or $R_3$ are cyanomethyl and cyanoethyl residues.

When $R_2$ has one or other of the foregoing meanings $R_3$ may have further meanings i.e. a hydrogen, alkyl, aryl, cycloalkyl, aralkyl or substituted alkyl such as OH, SH, $NR_2$ or $NH_2$; heterocyclic radical or a radical of formula II wherein $R_4$ has its preferred meaning as hereinbefore described.

When $R_3$ is alkyl radical it preferably contains from 1 to 12 carbon atoms; when $R_3$ is an aryl radical it is preferably a benzene or naphthalene radical; the preferred cycloalkyl radical $R_3$ is a cyclohexyl radical; the preferred aralkyl radical $R_3$ is a benzyl radical; and the preferred heterocyclic radicals $R_3$ are piperidine and morpholine radicals.

However, the most preferred compounds of the present invention are those of formula I wherein $R_4$ is benzene, unsubstituted or mono- or di-substituted by methyl or dimethylbenzyl radicals and wherein $R_2$ and $R_3$ are the same or different and each is a $R_7O$[(alkylene)O]$_x$(alkylene) radical or $R_2$ is such a radical and $R_3$ is hydrogen or a 1–4C alkyl; x is preferably 0.

Specific examples of compounds in accordance with the present invention include, but are not limited to:
1-diethanolaminomethyl benzotriazole
1-di-isopropanolaminomethyl benzotriazole
N,N-bis(1′-benzotriazolylmethyl)-ethanolamine
N,N-bis(1′-benzotriazolylmethyl)-iso-propanolamine
N,N-bis(1′-benzotriazolylmethyl)-ethoxyethoxypropylamine
N,N-bis(1′-benztriazolylmethyl)-palmitoylamine
N,N-bis(1′-benzotriazolylmethyl)allylamine These compounds are prepared in accordance with procedures disclosed in British Pat. No. 1,466,558 which are incorporated herein by reference. These compounds exhibit high solubility in a wide range of solvents including aqueous solvents. These additives are present in the subject photoresist compositions in the range of from about 0.01 to 5 weight percent, preferably 0.1 to 2 weight percent. Any unsubstituted benzotriazole adventitiously present does not adversely affect the bonding properties of the subject compositions.

It should be noted that the substituent on the benzene or naphthalene nucleus does not appreciably improve the bonding and durability properties of these compounds as adhesion promoters but the enumerated substituents particularly at the N-1 and N-2 positions bestow unexpectedly high adhesion promoting and stabilizing qualities on the compounds. However, halo or methyl substituents at the N-1 position render these classes of compounds unacceptable as adhesion promoters. Although bonding between the benzotriazoles and the metal surface has been suggested as a possible mode of operation for these compounds, there does not appear to be any chemical basis on which properties of the various substituted benzotriazoles as adhesion promoters may be predicated.

The photoresist compositions will normally be formulated in a suitable solvent, both aqueous and nonaqueous, usually an organic solvent, such as a ketone of from three to six carbon atoms, by themselves or in combination with alkanols of from one to three carbon atoms, or the like, wherein the solids will generally vary from about 5 to 80 weight percent, preferably about 25 to 60 weight percent.

The compositions of this invention can be supplied laminated onto a metal or a metal alloy sheet, such as copper, nickel, chromium, silver or gold, preferably a copper sheet, normally a laminate having a top copper layer in contact with the uncured photo resist composition. A protective film for the photoresist layer may also be provided resulting in a sandwich of the protective film, the uncured photoresist layer and the copper layer. The photoresist layer will generally have a dry thickness of from about 0.25 to 5, usually 0.75 to 4.0 mils. The protective layer will generally be from about 0.5 to 5 mils thickness and may be an inert addition or condensation polymer, such as polyolefins of from 2 to 4 carbon atoms, e.g. polypropylene, polyethlene terephthalate, or the like.

In use, the photopolymerizable dry film is exposed to a source of actinic radiation which may be through a half-tone image or a process transparency; e.g., a process negative or positive, stencil or a mask. Exposure may also be through a continuous tone, negative or positive image. The exposure can be by the contact or projection method, with or without a cover sheet over the photopolymerizable layer. These procedures are well known to those skilled in the art. The photoresist compositions are generally used in conjunction with ultraviolet light and the radiation source should furnish an effective amount of this radiation; point or broad radiation sources are equally effective. Such sources include carbon arcs, mercury-vapor arcs, fluorescent lamps with ultraviolet radiation emitting phosphors, argon glow lamps, electronic flash units and photographic flood lamps. Of these, the mercury vapor arcs, particularly the sun lamps, are most suitable.

The dry film photoresist compositions after exposure can be developed in any known manner, for example by impingement of spray jets, with agitated immersion brushing or scrubbing to desired images with an organic solvent, an aqueous solvent or mixture thereof capable of washing away the unexposed portions of the resist film. Useful solvents include cellosolve acetate, ethyl acetate, methyl ethyl ketone, acetone, 1,1,1;trichloroethane, tetrachloroethylene, the alkanols of one to four carbon atoms, butyl cellosolve, chrolobenzene and dimethylformamide or water or a mildly alkaline solution, which may contain small amounts of organic additives.

Since the photopolymerizable compositions of the subject invention are used as coatings on copper clad resin, fiberglass or polymer board, the base layer of copper becomes exposed after the preceding development step. The board is then made the cathode in a copper electroplating solution and electroplated at a cathode current density of approximately 15 to 35 amperes per sq. ft. at 1.5 volts for about 30 to 45 minutes. The resist is then stripped off after a ferric chloride insoluble metal is plated over the exposed copper. The unprotected areas were etched or washed away, to give usable printed circuit boards, lithographic plates, relief images, and for other similar uses in the graphic arts.

These methods are used advantageously in the preparation of thick (>0.002 inch) printed circuit boards. The presence of the heterocyclic adhesion promoter compounds in these formulations, eliminate postexposure baking and prevents the film lifting off the metal laminate, as evidenced by the tape test which consists of applying a self-sticking adhesive strip to each board and then pulling it off. The amount of resist left on the tape is proportional to the deterioration of the resist in the plating bath. There are more sophisticated test methods that are currently available for testing the adhesion properties of the photoresist compositions.

The following examples are to be construed as illustrative only and are not intended to limit in any way, the scope of the invention.

EXAMPLE I

The following photopolymerizable composition was prepared:

| | |
|---|---|
| 1-di-ethanolaminemethylbenzotriazole | 0.120 g |
| Methylmethacrylate polymer (inh.viscosity 0.60 in methylethylketone at 30° C.) | 4.2 g |
| Methylmethacrylate/ethylacrylate co-polymer (inh.viscosity 0.23 in methylethylketone at 30° C.) | 1.56 g |
| Low molecular weight chlorinated rubber, available under the Trade Mark Parlon S-5 | 3.60 g |
| Benzophenone | 0.850 g |
| 4,4'-bis(dimethylamino)benzophenone | 0.030 g |
| Trimethylolpropanetriacrylate | 2.700 g |
| Tetraethyleneglycoldiacrylate | 2.700 g |
| 4-methyl 2,6-di-t-butylphenol | 0.002 g |
| Dioctylphthalate | 0.100 g |
| 4,4',4''-Methylidenetris-(N,N-dimethylaniline) | 0.100 g |
| Brilliant Green Dye (C.I. 42040) | 0.002 g |
| Methylethylketone | 23.00 g |

The solution contains about 40% solid, and is coated with a "doctor knife" on 0.00092 inch, biaxially oriented and heat set polyethylene terephthalate film. The coating was air dried overnight resulting in a very light green film with a dry thickness of 0.00130 inches. A piece of copper clad epoxy-fiberglass board is scrubbed and dried using a Somaca Model SCS-12G scrubber. The copper board is laminated with the photopolymerizable composition using a standard photoresist laminator at 115° C., at the rate of 4–5 feet per minute. The resulting composite of polyester film, photopolymerizable composition and copper, has a slight green color with sufficient contrast under yellow lights to discern any bare copper. The copper sandwich is exposed for 10 seconds, to a transparency, using a Colight 1200 Watt DMVL-A ultraviolet exposure source. The board, which has a strong blue print-out image, was held for 10 minutes. The board is developed in a DuPont "C" processor containing 1,1,1-trichloroethane solvent as developer. The temperature was kept at 65°-68° F., while the spray pressure was controlled to 20 psi at a throughput rate of 6-7 ft/min. The board is immediately submersed in a soak cleaner containing a neutral detergent available under the Trade Mark Neutra Clean-68, 50% aqueous solution at room temperature for 1½-2 minutes. It is then spray rinsed in an overflow tank and immersed in a 20% ammonium persulfate solution for 1 minute. After rinsing in fresh water for 1 minute the board is dipped in a 15% sulfuric acid bath for 1 minute and rinsed again in fresh water for 1 minute. The board was placed in a copper pyrophosphate phosphate tank at 125° F., with a pH of 8.3 and plated for 45 minutes at 25 amps/sq. ft. After plating, the board was inspected and no haloing, colorchange or underplating was observed. Nor did the resist lift off the board using a standard tape test and Scotch Brand #600 self-sticking tape. In comparison, a board laminated with the above composition, but without the 1-di-ethanolaminemethylbenzotriazole present, showed a large extent of haloing around plated areas, appeared discolored and failed the standard tape test using Scotch brand 600 tape. Another set of boards was treated as above, but after copper pyrophosphate plating, was immediately rinsed in fresh water and dipped for 1 minute in 15% fluoboric acid. The boards were then plated for 30 minutes in lead/tin plating bath, using 15 amperes per square foor at ambient temperatures. As before, the composition containing the 1-di-ethanolamine-methyl-benzotriazole did not change color, halo or underplate. The control, without the benzotriazole, showed severe lifting of the resist and showed a great deal of underplating, especially in the areas that showed haloing. The resist was stripped and the copper, in the unprotected areas was etched away to give a usable printed circuit board, or a lithographic plate, or other types of relief image plates or cylinders.

EXAMPLE II

The composition of Example I was prepared except that the 1-di-ethanolamine-methyl-benzotriazole was replaced by 0.006 g of benzotriazole. This is the maximum amount of benzotriazole that may be adventitiously present as an impurity in the substituted benzotriazole solution. After exposing, developing and plating as in Example I, the board showed extensive discoloration, haloing and underplating. This indicated that such an amount of benzotriazole present even as an impurity in the 1-di-ethanolamine-methyl-benzotriazole has no additional effect on the adhesion promoting characteristics of 1-di-ethanolamine-methyl-benzotriazole.

EXAMPLE III

| | |
|---|---|
| Acrylic copolymer (contg. 56% ethylacrylate, 37% methacrylate, and 7% acrylic acid, with an inherent viscosity of 0.458 in methylethylketone at 30° C. | 12.63 g |
| Styrene-Maleic anhydride copolymer, partially esterfied. With an acid number of 270 and molecular weight of 1700 | 12.63 g |
| Triethylenegycol dimethacrylate | 6.67 g |
| 1-di-ethanolamine-methyl-benzotriazole | 0.30 g |

| -continued | |
|---|---|
| Benzophenone | 1.30 g |
| 4,4'-bis(dimethylamino)benzophenone | 0.067 g |
| Brilliant Green Dye (C.I. #42040) | 0.0027 |
| 4,4',4''-methylidenetris-(N,N,-dimethylaniline) | 0.39 g |
| 1,2,3,4,5-pentabromo-6-chlorocyclohexane | 0.63 g |
| Methylethylketone | 100.00 g |

The solution was coated to a dry thickness of 0.00150 inches. A piece of copper clad epoxy fiberglass board was cleaned and then laminated with the above photopolymer composition. The sandwich was exposed for 10 seconds, through a transparency, using the 1200 watt DMVL-A. The image was developed in a DEA Americana 2401 developer with a 30" spray chamber. The totally aqueous developer contains 0.75% by weight sodium carbonate monohydrate at 80°-85°. Using a spray pressure of 20 pounds per square inch and a throughput rate of 3.5 feet per minute the board is passed through the developer. After cleaning as in Example I, the board is plated in acid copper sulfate at 25 amperes and ambient temperatures for 45 minutes. The board was again rinsed and dipped into 15% fluoroboric acid and then plated for 30 minutes in a Lead/Tin plating bath using 15 amperes per square foot at ambient temperatures. The completed board showed no discoloration, haloing or underplating.

EXAMPLE IV

The following photopolymerizable composition was prepared:

| | |
|---|---|
| Methylmethacrylate polymer (inh.viscosity 0.60 in methylethylketone at 30° C.) | 4.2 g |
| Methylmethacrylate/ethylacrylate co-polymer (inh.viscosity 0.23 in methylethylketone at 30° C.) | 1.56 g |
| Low molecular weight chlorinated rubber (Parlon S-5) | 3.60 g |
| Benzophenone | 0.850 g |
| 4,4'-bis(dimethylamino)benzophenone | 0.030 g |
| Trimethylolpropanetriacrylate | 2.700 g |
| Tetraethyleneglycoldiacrylate | 2.700 g |
| 4-methyl-2,6-di-t-butylphenol | 0.002 g |
| Dioctylphthalate | 0.100 g |
| 4,4'4''-Methylidenetris-(N,N-dimethylaniline) (leuco dye) | 0.100 g |
| Brilliant Green (C.I. #42040) | 0.002 g |
| Methylethylketone | 23.00 g |
| Additive (one of the compounds shown below) | 0.240 g |

A. Benzotriazole
B. 1-diethanolaminemethyl-benzotriazole
C. 1-dripropylaminemethyl-benzotriazole
D. 1-ethyl-1-ethanolaminemethyl-benzotriazole
E. The reaction product between two moles of benzotriazole, 2 moles of formalin and 1 mole of cyclohexylamine. $C_6H_{11}N(CH_2C_6H_4N_3)_2$
F. The reaction product of 2 moles benzotriazole, 2 moles formalin and 1 mole 3(di-n-butylamino)propylamine. $(C_6H_4N_3CH_2)_2N(CH_2)_3N(CH_2CH_2CH_2CH_3)_2$
G. The reaction product between 4 moles benzotriazole, and formalin with 1 mole 1,6 hexanediamine. $(C_6H_4N_3CH_2)_2N(CH_2)_6N(C_6H_4N_3CH_2)_2$ After exposure and development as in Example I the boards were placed in a 50% aqueous neutral detergent cleaner, sold as Neutra-Clean 68, at ambient temperature, rinsed with water, dipped for 1 minute in a 15% sulfuric acid solution, rinsed and then plated as in Example I.

The plated copper was then tested for adhesion by attempted scrapings.

| Additive | Results |
|---|---|
| A. | Cu peeled off |
| B. | Cu could not be removed |
| C. | Cu could not be removed |
| D. | Cu could not be removed |
| E. | Cu could not be removed |
| F. | Cu could not be removed |

EXAMPLE V

TABLE 1

| Cmpd. | | Water Soluble |
|---|---|---|
| 1. | R—CH$_2$N(CH$_2$CH$_2$OH)$_2$ | yes |
| 2. | R—CH$_2$N(CH$_3$)(C$_2$H$_4$OH) | yes |
| 3. | R—CH$_2$N(C$_2$H$_5$)(C$_2$H$_4$OH) | partially |
| 4. | R—CH$_2$N(C$_2$H$_5$)$_2$ | no |
| 5. | R—CH$_2$N(CH$_2$CH$_2$CH$_3$)$_2$ | no |
| 6. | (R—CH$_2$)$_2$N(CH$_2$)$_3$N(CH$_2$CH$_2$CH$_2$CH$_3$)$_2$ | no |
| 7. | (R—CH$_2$)$_2$N(CH$_2$)$_6$N(CH$_2$—R)$_2$ | no |
| 8. | (R—CH$_2$)$_2$N(C$_6$H$_{11}$) | no |

R = Benzotriazole substituted on either the N-1 or N-2 position.

Nine solvent processable compositions of Example I were prepared and equimolar amounts of the above materials, including benzotriazole, were added. Similarly, aqueous developable compositions of Example III were prepared. Each of the compositions was laminated, exposed and developed. Then one sample of each composition was treated with ammonium persulfate whereas in the control, that step was eliminated. All were acid copper plated and tested for peelers, (Poor adhesion of plated copper). All the compounds tested exhibited acceptable adhesion properties with the exception of benzotriazole when no persulfate treatment was used.

EXAMPLE VI

The photopolymer composition of Example III was prepared, except that two different weight percent of the following compounds were used:
(a) 1-diethanolamine-methyl-benzotriazole
(b) 1-dipropylamine-methyl-benzotriazole
(c) benzotriazole Coating solutions a-1, b-1 and c-1 contained 0.02 weight percent of the compounds, solutions a-2, b-2, and c-2 contained 0.16 wt percent. Coating solution d contained none. The seven solutions were stirred under bright yellow lights for 8 hours and then coated to a dry thickness of 1.5 mil on 0.92 mil polyethyleneterphthalate and then laminated with 1-mil polyethylene. These films were then placed for 4 days under standard yellow light conditions. The results of the effects of the additives upon color stability in the solution and coatings are given below.

| | | color of coating soln. color of coating | | |
|---|---|---|---|---|
| | | day 1 | day 2 | day 4 |
| a | 1 | light blue-green | lt. blue-grn. | slight darkening |
| | 2 | " | " | no darkening |
| b | 1 | " | " | slight darkening |
| | 2 | " | " | no darkening |
| c | 1 | slight darkening | slight darkening | turned dark blue |
| | 2 | " | " | " |

| | color of coating soln. color of coating | | |
|---|---|---|---|
| | day 1 | day 2 | day 4 |
| d | dark solution | darkened vs a-1 | turned very dark |

This increase in background density had no effect on the photopolymerization reaction as was indicated by the exposure development rate data.

EXAMPLE VII

A coating composition was prepared from the following ingredients:

| Actomer X-80 (epoxidized soya bean oil from Union Carbide) | 30.00 | gram |
|---|---|---|
| Trimethylolpropane triacrylate | 20.00 | " |
| Pentaerythritol triacrylate | 10.00 | " |
| Vinyl Acetate | 20.00 | " |
| Benzophenone | 12.00 | " |
| 4,4'-bis(dimethylamino)benzophenone | 1.0 | " |
| 1,2,3,4,5-pentabromo-6-chlorocyclohexane | 1.5 | " |
| Leuco Crystal Violet | 1.0 | " |

To the above solution were added in (a) 0.465 g 1-diethanolamine-methyl-benzotriazole, (b) 0.465 g benzotriazole, (c) none.

The solution was coated on a piece of copper board with a 10 mil "doctor knife." The tacky coatings were exposed to high intensity UV light source for 60 sec. (DMVL-A, 1200 Watt Bulb). The standard tape test showed that coating "a" had best adhesion, followed by "b" and then "c." Solution stability, as observed by color change, was in the same order.

The above data indicate that in all cases treatment with ammonium persulfate solution removes any remaining adhesion promoter from the copper surface. In the case of the solvent film, the persulfate treatment step may be skipped when an oleophilic benzotriazole derivative is used. Similarly, using an aqueous developable film, with hydrophilic benzotriazole derivatives, allows skipping of the persulfate bath. This is of particular advantage when thin electroless copper is used. Under most circumstances, excessive electroless copper must be plated to allow the boards to be cleaned in persulfate without removing all of the electroless copper, prior to the board entering the electrolytic plating cycle.

All of the experimental examples presented above provide stable printed circuit boards or lithographic plates or relief image plates or cylinders. The photoresist compositions exhibited all of the desirable properties enumerated, namely that the adhesion promoter:
1. was easily removed from the copper surface during the development step, when
   (a) in the case of the solvent film, it was oleophilic;
   (b) in the case of the aqueous film, it was hydrophilic;
2. had a sufficiently high boiling point greater than 200° C.;
3. the coated film was stable for a period of about 1 year at ambient conditions;
4. the coated film was stable at elevated temperatures (33°-35° C.) for at least 4–8 weeks;
5. did not interfere with the photopolymerization reaction;
6. did not interfere with the plating cycle or leach out into the plating bath.

The formulations of the subject invention thus have decided advantages over prior art compositions. While the above description provides a full and complete disclosure of the preferred embodiments of the subject invention, various modifications, alternative constructions, equivalents and improvements may be practised without departing from the spirit and scope of the appended claims.

What is claimed is:

1. In a photopolymerizable composition for use in photoresists, comprising:
    a non-gaseous photopolymerizable compound containing 1 to 4 centers of ethylenic unsaturation and capable of photo-initiated addition polymerization;
    a thermoplastic polymer binder;
    an addition polymerization initiator activatable by actinic radiation; and
    an adhesion promoter;
    the improvement of using an adhesion promoter having the formula

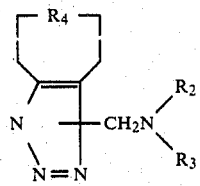

wherein $R_4$ is a benzene or naphthalene radical, each unsubstituted or mono- or di-substituted with alkyl radicals having from 1 to 12 carbon atoms or aralkyl radicals having from 7 to 9 carbon atoms; $R_2$ is a radical of the formula $R_7O[(alkylene)O]_x$-(alkylene)-, wherein $R_7$ is hydrogen or an alkyl radical having from 1 to 20 carbon atoms, "alkylene" is a straight or branched chain alkylene radical having 2 or 3 carbon atoms and x is 0, 1, 2, 3 or 4; an alkenyl radical having from 2 to 20 carbon atoms or a cyanoalkyl radical having from 2 to 5 carbon atoms; and $R_3$ is the same as $R_2$ or hydrogen; an alkyl radical having from 1 to 20 carbon atoms; an aryl radical having from 6 to 10 carbon atoms; a cycloalkyl radical having from 5 to 12 carbon atoms; an aralkyl radical having from 7 to 9 carbon atoms; a heterocyclic radical or a radical of formula:

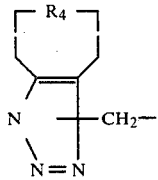

wherein $R_4$ has its previous significance.

2. A composition in accordance with claim 1, wherein $R_4$ is a benzene radical.

3. A composition in accordance with claim 1 wherein $R_3$ or $R_2$ in said adhesion promoter is a radical having the formula $R_7O[(alkylene)O]_x$-alkylene wherein $R_7$ and x are as defined in claim 1.

4. A composition in accordance with claim 3, wherein $R_7$ is H and x is O.

5. A composition in accordance with claim 1, wherein $R_4$ in said adhesion promoter is an unsubstituted benzene radical or a benzene radical substituted by a methyl or dimethylbenzene radical and wherein $R_2$ is a $R_7O$-alkylene-radical, wherein $R_7$ is hydrogen or an alkyl radical having from 1 to 4 carbon atoms and $R_3$ is the same as $R_2$, a hydrogen or a 1-4C alkyl radical.

6. A composition in accordance with claim 1, wherein said promoter is selected from the group consisting of
1-diethanolaminomethyl benzotriazole
1-di-isopropanolaminomethyl benzotriazole
N,N-bis(1'-benzotriazolylmethyl)-ethanolamine
N,N-bis(1'-benzotriazolylmethyl)-isopropanolamine
N,N-bis(1'-benzotriazolylmethyl)-ethoxyethoxypropylamine
N,N-bis(1'-benzotriazolylmethyl)-palmitoylamine and
N,N-bis(1'-benzotriazolylmethyl)-allylamine.

7. A composition in accordance with claim 1, wherein at least one coloring dye selected from Brilliant Green dye, Victoria Blue and substituted naphthalimide dyes, is included.

8. A composition in accordance with claim 1, wherein at least one leuco coloring dye selected from leuco Crystal Violet, leuco Malachite Green, leuco Basic Blue, leuco Pararosaniline, leuco Rosaniline, leuco Patent Blue A and leuco Patent Blue V is included.

9. A photopolymerizable composition in accordance with claim 1, wherein the non-gaseous photopolymerizable compound containing 1 to 4 centers of ethylenic unsaturation constitutes from about 15-30 weight percent of the composition; the addition polymerization initiator constitutes from about 0.01 to 1.0 weight percent of the composition; the thermoplastic polymer binder constitutes from about 40 to 80 weight percent of the composition; and the adhesion promoter constitutes from about 0.01 to 5 weight percent of the composition.

10. A composition in accordance with claim 1, wherein said composition is constituted as a solution in a solvent, and containing from about 10 to 30 weight percent solids.

11. In a photoresist element comprising:
(a) a solid support comprising a metal or metal alloy foil laminated to an epoxy or fiberglass or polyester resin board; and
(b) laminated onto said support, a photopolymerizable composition comprising:
    an addition photopolymerizable monomer containing 1 to 4 centers of ethylenic unsaturation;
    a thermoplastic polymer binder;
    an addition polymerization initiator activatable by actinic radiation; and
    an adhesion promoter;
the improvement of using an adhesion promoter having the formula

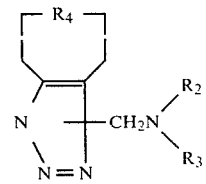

wherein $R_4$ is a benzene or naphthalene radical, each unsubstituted or mono- or di-substituted with alkyl radicals having from 1 to 12 carbon atoms or aralkyl radicals having from 7 to 9 carbon atoms, $R_2$ is a radical of the formula $R_7O[(alkylene)O]_x$-(alkylene)-, wherein $R_7$ is hydrogen or an alkyl radical having from 1 to 20 carbon atoms, "alkylene" is a straight or branched chain alkylene radical having 2 or 3 carbon atoms and x is 0, 1, 2, 3 or 4; an alkenyl radical having from 2 to 20 carbon atoms or a cyanoalkyl radical having from 2 to 5 carbon atoms; and $R_3$ is the same as $R_2$ or hydrogen; an alkyl radical having from 1 to 20 carbon atoms; and aryl radical having from 6 to 10 carbon atoms; a cycloalkyl radical having from 5 to 12 carbon atoms; an aralkyl radical having from 7 to 9 carbon atoms; a heterocyclic radical or a radical of formula:

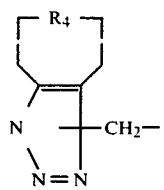

wherein $R_4$ has its previous significance.

12. In a method for preparing an improved printed circuit board comprising the steps of:

(a) image-wise exposing a photopolymerizable composition laminated onto a solid support and covered with a protective film, through a transparency, to actinic light to form an insoluble polymer image in the exposed areas of the photopolymerizable layer;

(b) removing the protective film from said laminate;

(c) washing away the unexposed portions of the photopolymerizable layer by means of a solvent therefor;

(d) plating onto said element sufficient amount of a metal; and (e) treating said laminate to strip said resist mask from said laminate;

the improvement of including in said photopolymerizable composition an adhesion promoter having the formula

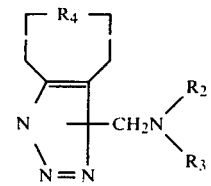

wherein $R_4$ is a benzene or npahthalene radical, each unsubstituted or mono- or di-substituted with alkyl radicals having from 1 to 12 carbon atoms or aralkyl radicals having from 7 to 9 carbon atoms, $R_2$ is a radical of the formula $R_7O[(alkylene)O]_x$-(alkylene)-, wherein $R_7$ is hydrogen or an alkyl radical having from 1 to 20 carbon atoms, "alkylene" is a straight or branched chain alkylene radical having 2 or 3 carbon atoms and x is 0, 1, 2, 3 or 4; an alkenyl radical having from 2 to 20 carbon atoms or a cyanoalkyl radical having from 2 to 5 carbon atoms; and $R_3$ is the same as $R_2$ or hydrogen; an alkyl radical having from 1 to 20 carbon atoms; and aryl radical having from 6 to 10 carbon atoms, a cycloalkyl radical having from 5 to 12 carbon atoms; an aralkyl radical having from 7 to 9 carbon atoms; a heterocyclic radical or a radical of formula:

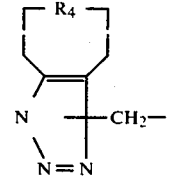

wherein $R_4$ has its previous significance.

* * * * *